(12) United States Patent
Lo et al.

(10) Patent No.: US 7,576,287 B2
(45) Date of Patent: Aug. 18, 2009

(54) LOT TRACEABLE PRINTED CIRCUIT BOARD

(75) Inventors: Hsing-Lun Lo, Taipei (TW);
Hsien-Chieh Lin, Taoyuan County (TW); Kuo-Chun Chiang, Taoyuan (TW); Shing-Fun Ho, Taipei (TW)

(73) Assignee: Nan Ya Printed Circuit Board Corporation, Luchu, Taoyuan (TW)

( * ) Notice: Subject to any disclaimer, the term of this patent is extended or adjusted under 35 U.S.C. 154(b) by 443 days.

(21) Appl. No.: 11/673,596

(22) Filed: Feb. 12, 2007

(65) Prior Publication Data

US 2008/0149732 A1 Jun. 26, 2008

(30) Foreign Application Priority Data

Dec. 20, 2006 (TW) .............................. 95147921 A

(51) Int. Cl.
*H05K 1/00* (2006.01)
(52) U.S. Cl. ........................................ 174/250; 174/255
(58) Field of Classification Search ................. 174/250, 174/255
See application file for complete search history.

(56) References Cited

U.S. PATENT DOCUMENTS

| | | | | |
|---|---|---|---|---|
| 5,451,885 A | * | 9/1995 | Birch et al. .................. 324/760 |
| 5,873,990 A | * | 2/1999 | Wojciechowski et al. ... 204/406 |
| 5,877,033 A | * | 3/1999 | Matern ........................ 438/14 |
| 6,300,771 B1 | * | 10/2001 | Goshima .................... 324/550 |
| 6,333,635 B1 | * | 12/2001 | Lee et al. .................... 324/754 |
| 7,120,287 B2 | * | 10/2006 | Wilson et al. ............... 382/145 |
| 7,263,501 B2 | * | 8/2007 | Tirinato et al. ................ 705/28 |
| 2004/0108862 A1 | * | 6/2004 | Azuma et al. ............... 324/691 |
| 2007/0202007 A1 | * | 8/2007 | Augstein et al. .............. 422/56 |

* cited by examiner

*Primary Examiner*—Jeremy C Norris
*Assistant Examiner*—Xiaoliang Chen
(74) *Attorney, Agent, or Firm*—Winston Hsu

(57) ABSTRACT

A lot traceable printed circuit board (PCB) includes a substrate having thereon a patterned circuit layer and a working zone carrying production information related to the PCB itself. The working zone includes a plurality of code boxes, wherein each of the code boxes has a first probe region and second probe region. A single set of resistance test loop is disposed within the first probe region. Four sets of resistance test loops are disposed within the second probe region. A frying probe tester is used to probe the set of resistance test loops respectively for abstracting the production information recorded in the working zone.

7 Claims, 2 Drawing Sheets

LOT TRACEABLE PRINTED CIRCUIT BOARD

BACKGROUND OF THE INVENTION

1. Field of the Invention

The present invention relates to a printed circuit board. More particularly, the present invention relates to a printed circuit board structure, which facilitates tracing back and identifying the production information of each finished printed circuit board quickly and effectively.

2. Description of the Prior Art

As known by persons of ordinary skill in the art, the manufacturing process of printed circuit boards (PCBs) usually starts with a bulk of substrate as a starting material. First the inner-layer connect is produced to form the necessary layout, which includes pre-treatment, photo-resist application, exposure, development, etching and removal of the photo-resist, then the surface of copper is roughened to increase the adhesion to the insulation resins. Afterwards, they are laminated with plastic sheets. The electric conductivity is accomplished through holes by mechanic or laser means. The inter-substrate electric conductivity is accomplished by electroplating method. After the above steps the outer layer of the circuit boards is applied with a solder-resist to avoid short circuits when solder overflows during soldering and to work as a barrier to prevent the vapor and oxygen in the air from penetrating.

After the solder-resist is applied, a serial number or any necessary production information is formed on a pre-determined location of the substrate by printing or laser. Last, the substrate is diced to obtain multiple final PCBs and an electronic test is carried out on each PCB.

However, the current problem is that after the substrate is diced to multiple final PCBs, each final PCB does not possess a corresponding number such as lot number and panel number. In such a way, it is almost impossible to trace back flawed PCBs regarding the production lines, batch numbers and racks.

Accordingly, it is necessary to provide a low-cost method which is compatible with current process to effectively identify the production information such as panel number of each finished printed circuit board produced by multiple factories and different production lines/batch lines after dicing and to identify the flawed PCBs regarding the batch lines and the rack and to perform the root cause analysis.

SUMMARY OF THE INVENTION

The present invention provides novel PCBs with lot traceable features to solve the above-mentioned information.

According to one preferred embodiment of the present invention, the present invention provides a lot traceable PCB which includes a substrate having thereon a patterned circuit layer and a working zone carrying production information related to the PCB per se. The working zone includes a plurality of code boxes, wherein each of the code boxes has a first probe region and second probe region. A single set of resistance test loop is disposed within the first probe region. Four sets of resistance test loops are disposed within the second probe region. A frying probe tester is used to probe the set of resistance test loops respectively for abstracting the production information recorded in the working zone.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
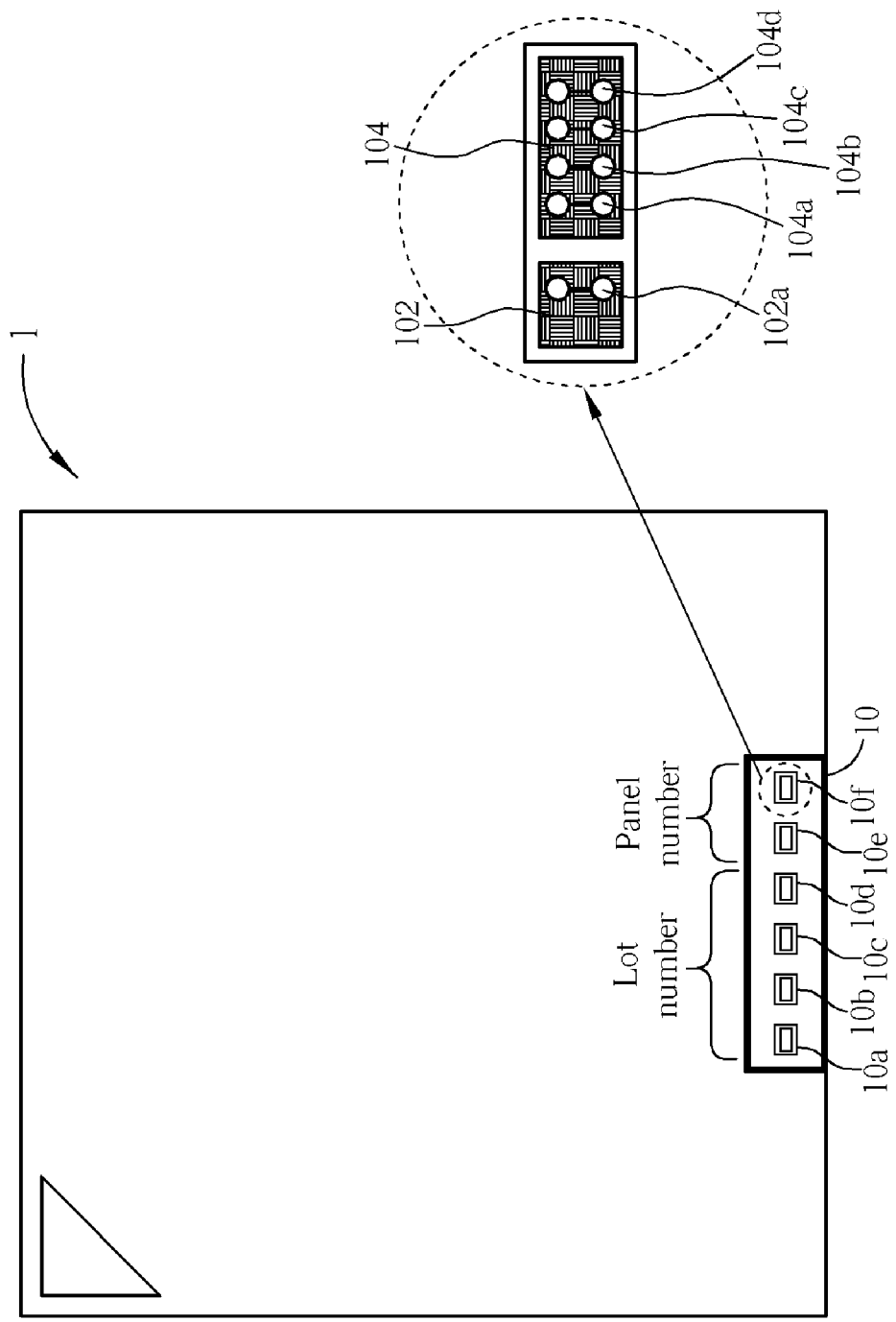
FIG. 1 is the top view of the PCB of a preferred embodiment of the present invention.

FIG. 1 is the top view of the PCB of a preferred embodiment of the present invention. As shown in FIG. 1, PCB 1 may be a final product after dicing and includes patterned circuits (not shown) and a working zone 10 carrying production information such as lot number and panel number. The working zone 10 may be disposed on a periphery region of the printed circuit board 1 or disposed on a region with no patterned circuit layer. In addition, PCB 1 may include an insulation layer such as ABF (Ajinomoto Build-Up) film and a protection layer such as solder-resistant. These are known in the art and will not be described in detail.

The working zone 10 includes a plurality of code boxes 10a-10f. According to one preferred embodiment of the present invention, the foremost four code boxes, i.e. code boxes 10a-10d, represent lot number and the latter two code boxes, i.e. code boxes 10e-10f, represent panel number. But these illustrations are for example only and not intended to limit the present invention.

According to another preferred embodiment of the present invention, the production information such as lot number and panel number is abstracted by a resistance measuring device, such as a frying probe tester. The device is usually useful and convenient in electronic test after dicing.

FIG. 1 also includes an enlarged view of one of the code box. Each code box 10a-10f in the working zone 10 has a first probe region 102 and a second probe region 104. The first probe region 102 has only one set of resistance test loop 102a and the second probe region 104 has four sets of resistance test loops 104a-104d.

Figure 2:
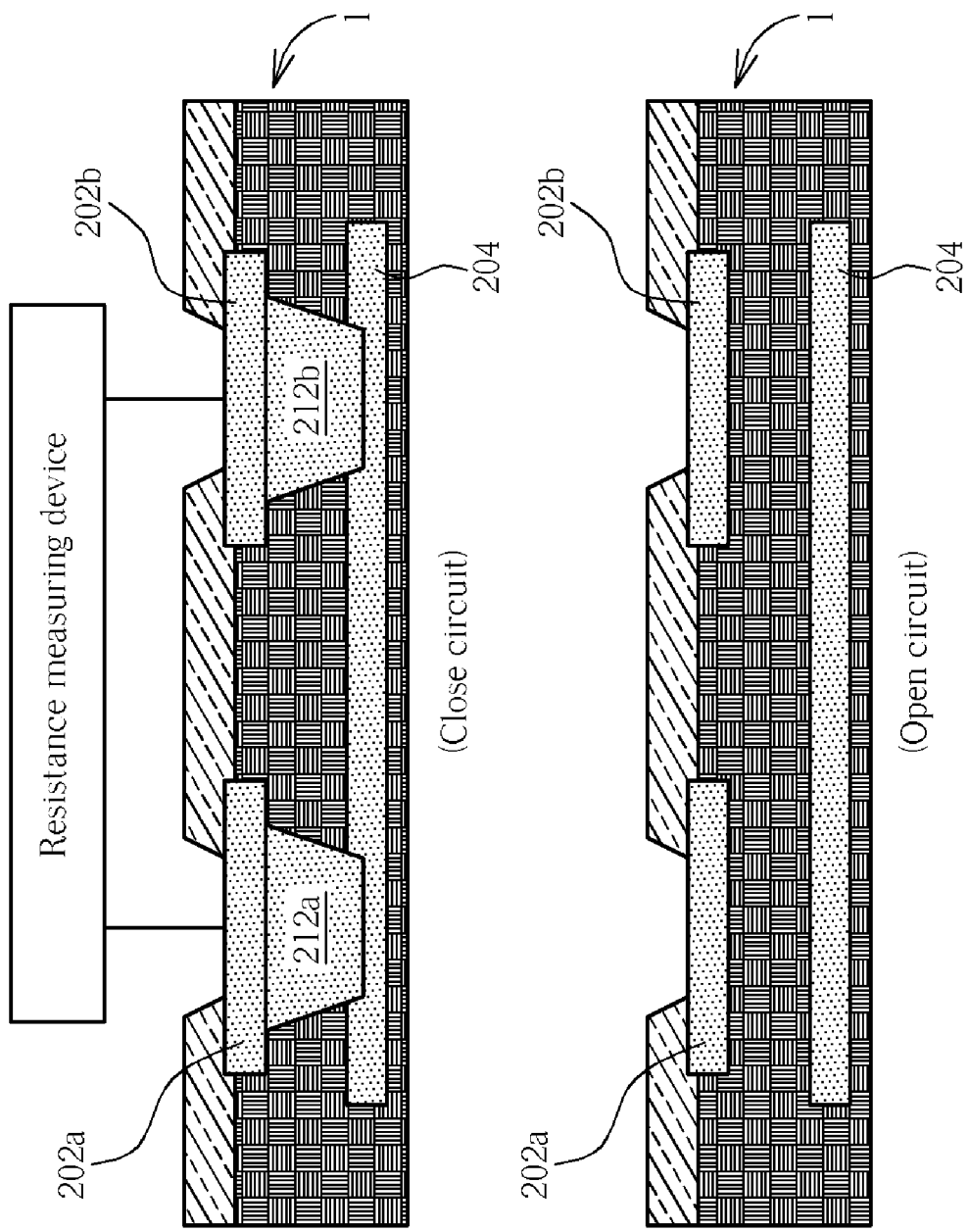
FIG. 2 is a section view of each resistance test loop in closed circuit and in open circuit.

Please refer to FIG. 2 simultaneously, which illustrates a section view of each resistance test loop in closed circuit and in open circuit in FIG. 1. As shown in FIG. 2, each resistance test loop on the front side of the PCB 1 has probe pads 202a and 202b, which form a circuit through holes 212a and 212b in the PCB 1 and the wire 204 formed on the back of the PCB 1. If there is no holes 212a and 212b, i.e. both or one of holes 212a and 212b are omitted intentionally during production, it is a closed circuit.

Accordingly, the technical features of the present invention resides in the production information such as lot number and the panel information regarding PCB 1 is produced and embedded in each working zones 10 of the PCB 1 during the production rather than recorded after finishing or dicing. This method saves a lot of time and is quite reliable.

According to one preferred embodiment of the present invention, the open circuit and the closed circuit of each resistance test loop in the code boxes 10a-10f of the working zone 10 represent numbers 0-9. For example, after being probed by the frying probe tester, if the resistance test loop 102a in the first probe region 102 is closed circuit it represents "5." If it is open circuit, it represents "0." If every resistance test loop 104a-104d in the second probe region 104 is closed circuit it represents "1." If they are open circuit, it represents "0."

For example, if the resistance test loop 102a in the first probe region 102 and every resistance test loop 104a-104d in the second probe region 104 are closed circuit it represents "9." If the resistance test loop 102a in the first probe region 102 is closed circuit and only resistance test loops 104a and 104b in the second probe region 104 are closed circuit it represents "7" and so on.

To sum up, the present invention utilizes the method of manufacturing and embedding the manufacturing information such as lot numbers and the panel numbers of the PCBs onto the working zones 10 on a specific location on the PCBs during the manufacturing process of the PCBs, which is completely compatible with the current process. The information such as lot number and the panel number is then abstracted by a frying probe tester by means of resistance measuring. It is convenient and reliable. Therefore, the present invention can more efficiently deal with the problem of identifying the information such as the panel numbers of each PCB products which are produced by multiple factories and different production lines/batch lines and further identifying the flawed PCBs regarding the production lines, batch lines and racks to perform the root cause analysis.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lot traceable printed circuit board (PCB) comprising:
   a substrate having a patterned circuit layer thereon; and
   a working zone carrying production information related to said PCB and comprising a plurality of code boxes, wherein each of said code boxes has a first probe region and a second probe region, and said first probe region has a single set of resistance test loop and said second probe region has four sets of resistance test loops, wherein said production information in said working zone is abstracted by a frying probe tester through probing the set of resistance test loops, respectively.

2. The lot traceable printed circuit board of claim 1, wherein each code box records or represents for a number selected from 0-9.

3. The lot traceable printed circuit board of claim 1, wherein an electric conductivity or not of said single set of resistance test loop in said first probe region represents for number 5 and 0, respectively.

4. The lot traceable printed circuit board of claim 1, wherein an electric conductivity or not of said each set of resistance test loops in said second probe region represents for number 1 and 0, respectively.

5. The lot traceable printed circuit board of claim 1, wherein on a front surface of said substrate said resistance test loop has a pair of resistance test pads to establish an electric conductive condition if there is a test hole in said substrate and a corresponding wire on the back of said substrate to form a circuit and a broken circuit condition if there is no test hole in said resistance test loop.

6. The lot traceable printed circuit board of claim 1, wherein said working zone is disposed on a periphery region of said printed circuit board.

7. The lot traceable printed circuit board of claim 1, wherein said working zone is disposed on a region where no patterned circuit layer is formed.

* * * * *